(12) United States Patent
Singh et al.

(10) Patent No.: US 12,025,971 B2
(45) Date of Patent: Jul. 2, 2024

(54) SOCKET INTERPOSER FOR SYSTEM-IN-PACKAGE (SIP) MODULE QUALIFICATION IN PRODUCT PLATFORM VALIDATION (PPV) SETUP

(71) Applicant: Intel Corporation, Santa Clara, CA (US)

(72) Inventors: Navneet Singh, Bangalore (IN);
Samarth Alva, Bangalore (IN);
Amarjeet Kumar, Bangalore (IN);
Gaurav Hada, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 17/667,551

(22) Filed: Feb. 9, 2022

(65) Prior Publication Data

US 2023/0251629 A1    Aug. 10, 2023

(51) Int. Cl.
| | | |
|---|---|---|
| *G05B 19/4155* | (2006.01) | |
| *H01L 23/373* | (2006.01) | |
| *H01L 23/538* | (2006.01) | |
| *H01R 12/70* | (2011.01) | |
| *H05K 1/18* | (2006.01) | |

(52) U.S. Cl.
CPC ...... *G05B 19/4155* (2013.01); *H01L 23/3736* (2013.01); *H01L 23/538* (2013.01); *H01R 12/70* (2013.01); *G05B 2219/40269* (2013.01); *G05B 2219/45031* (2013.01); *H05K 1/181* (2013.01); *H05K 2201/10378* (2013.01)

(58) Field of Classification Search
CPC ...... G05B 19/4155; G05B 2219/40269; G05B 2219/45031; H01L 23/3736; H01L 23/538; H01R 12/70; H05K 1/181; H05K 2201/10378; G01R 31/2874; G01R 31/2891; G01R 31/2863; G01R 1/07378; G01R 1/0466; G01R 1/00; G01R 31/00
USPC .............................................................. 439/55
See application file for complete search history.

(56) References Cited

U.S. PATENT DOCUMENTS

| | | | |
|---|---|---|---|
| 10,564,212 B2* | 2/2020 | Mardi | G01R 31/69 |
| 11,043,484 B1* | 6/2021 | Shi | G01R 31/2863 |
| 2008/0061808 A1* | 3/2008 | Mok | G01R 1/07357 |
| | | | 427/98.6 |
| 2009/0015279 A1* | 1/2009 | Cho | G01R 1/0483 |
| | | | 324/756.02 |
| 2017/0010305 A1* | 1/2017 | Liao | G01R 1/07314 |
| 2017/0187133 A1* | 6/2017 | Sepic | H01R 12/7076 |
| 2019/0128950 A1* | 5/2019 | Mardi | G01R 31/2891 |
| 2019/0128956 A1* | 5/2019 | Mardi | G01R 31/69 |
| 2021/0055342 A1* | 2/2021 | Qu | G01R 31/2863 |

(Continued)

*Primary Examiner* — Alexander Gilman
(74) *Attorney, Agent, or Firm* — VIERING, JENTSCHURA & PARTNER MBB

(57) ABSTRACT

An apparatus includes a memory interposer including a socket including an inner surface, one or more memories disposed on the inner surface, a bottom surface opposite to the inner surface, and pogo pins disposed on the bottom surface and respectively corresponding to the one or more memories, the pogo pins being configured to connect the one or more memories to a printed circuit board (PCB) including a semiconductor die. The apparatus further includes an intermediate thermal head attached to the memory interposer. The memory interposer is movable with respect to the intermediate thermal head.

19 Claims, 6 Drawing Sheets

(56) References Cited

U.S. PATENT DOCUMENTS

| | | | |
|---|---|---|---|
| 2021/0055343 A1* | 2/2021 | Qu | G01R 1/0458 |
| 2022/0284982 A1* | 9/2022 | Ranganathan | G11C 29/56016 |
| 2022/0299563 A1* | 9/2022 | Ranganathan | G01R 31/2863 |
| 2023/0251629 A1* | 8/2023 | Singh | G01R 1/0466 |
| | | | 700/121 |

* cited by examiner

SOCKET INTERPOSER FOR SYSTEM-IN-PACKAGE (SIP) MODULE QUALIFICATION IN PRODUCT PLATFORM VALIDATION (PPV) SETUP

BACKGROUND

There may be a need to have an overall core (a system-on-chip (SoC), power delivery and memory) as a system-in-package (SIP) module in smaller form factor segments. While the SIP module may allow flexibility, it may limit memory configuration. In the thin and light premium laptop segment, such as Intel's Lunar Lake (LNL) M segment, there is a SIP module that runs at process of record (POR) speed and includes disintegrated dies for an SoC, a graphics processing unit (GPU) and a central processing unit (CPU). Along with those, direct cache accesses (DCAs) for memories are attached to a printed circuit board (PCB) of the SIP module. On the SIP module, there are 64-bit POP memories supported with limited vendor support. The SIP module may need to be scaled for mainstream production so that volume in the segment may be increased.

Further, an SIP module may bring an additional challenge of sampling, binning, and sorting the SIP module before shipping to a customer site. In detail, for a chip with a monolithic die, there may be a defined process and setup for binning where the chip is tested. Using the SIP module may bring in a larger number of variables and hence additional challenges. For example, every set of memory chips may need to be dissembled for replacing the SIP module with new silicon, which may be cumbersome as this involves additional steps and variability.

To address the above challenge, more SIP modules may be used for testing. Further, SIP modules may include thin, light and compact designs using an SoC with only a POP memory assembled on an SoC package and with no onboard memory support. However, these prior solutions may have product reliability concerns due to wear and tear while testing. They also do not allow a modular memory configuration because they include soldered-down memory configurations. In addition, manual intervention required to replace memory parts for each testing may be more time consuming and more prone to errors and mistakes.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
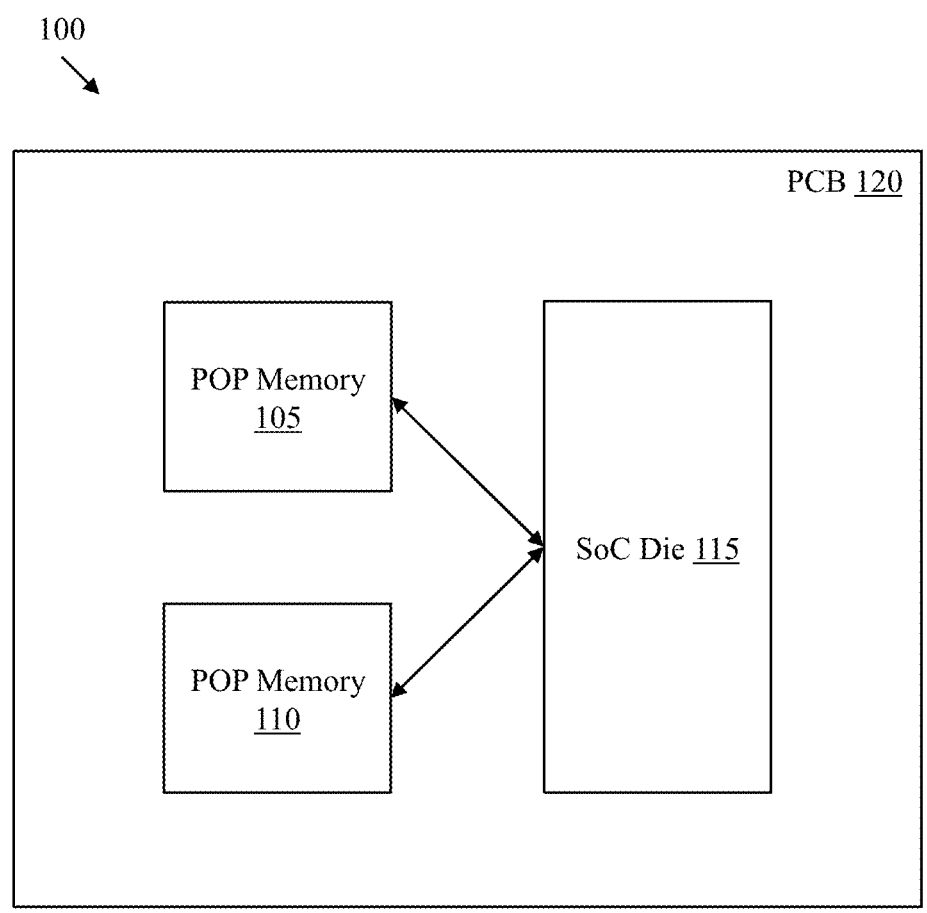
FIG. 1 is a block diagram of an SIP module.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a socket for an SIP module that may simplify testing of the SIP module in a PPV setup, automate the testing, and eliminate manual intervention during the testing, to reduce chances of errors and misses. A memory interposer integrated with a test memory jig is designed to allow quicker assembly and disassembly of memory parts into the SIP module and its fixtures. The assembly and disassembly are taken care of by a robotic hand so that accuracy is maintained for the testing with an amount of predictability that qualifies for criteria before shipping a final product. Aspects of the present disclosure further eliminate issues of wear and tear of the SIP module, especially a memory footprint of solder pads or balls.

A present apparatus may include a memory interposer including a socket including an inner surface, one or more memories disposed on the inner surface, a bottom surface opposite to the inner surface, and pogo pins disposed on the bottom surface and respectively corresponding to the one or more memories, the pogo pins being configured to connect the one or more memories to a printed circuit board (PCB) including a semiconductor die. The apparatus further includes an intermediate thermal head attached to the memory interposer. The memory interposer is movable with respect to the intermediate thermal head.

In another aspect, a method pursuant to the present disclosure may include controlling a robotic arm to place a printed circuit board (PCB) including a semiconductor die, in a test socket plate, and controlling the robotic arm to move a memory interposer attached to an intermediate thermal head, over the PCB placed in the test socket plate, the memory interposer including one or more memories connectable to the PCB. The method may further include controlling to apply, via a main thermal head disposed on the memory interposer attached to the intermediate thermal head, a desired load on the PCB over which the memory interposer attached to the intermediate thermal head is moved.

In yet another aspect, a present non-transitory computer-readable medium may include instructions, which, if executed by a processor, cause the processor to control a robotic arm to place a printed circuit board (PCB) including a semiconductor die, in a test socket plate, and control the robotic arm to move a memory interposer attached to an intermediate thermal head, over the PCB placed in the test socket plate, the memory interposer including one or more memories connectable to the PCB. The instructions, which, if executed by the processor, may further cause the processor to control to apply, via a main thermal head disposed on the memory interposer attached to the intermediate thermal head, a desired load on the PCB over which the memory interposer attached to the intermediate thermal head is moved.

The above-described aspects allow for an automated PPV setup for testing a SIP module for silicon binning, and for use of multiple memory technologies with the SIP module. Further, the aspects may enable dual-rank memory devices to scale memory density.

FIG. 1 is a block diagram of an SIP module 100.

Referring to FIG. 1, one or more package on package (POP) memories 105 and 110 may be connected to the SIP module 100 including an SoC die 115 disposed on a PCB 120. In embodiments, the SIP module 100 may further include CPU and GPU dies (not shown).

Each of the POP memories 105 and 110 may include 64-bit Low-Power Double Data Rate (LPDDR) 5× synchronous dynamic random-access memory (SDRAM), which may allow for DCAs. However, this is only an example, and other types of memory may be used. By having the POP memories 105 and 110 connected to the SIP module 100, the PCB 120 may be further miniaturized, memory routing channels may be shortened to improve signal integrity, and in turn, drive strength may be optimized to reduce power consumption.

However, the SIP module 100 may be shipped without the POP memories 105 and 110 to perform testing of the SIP module 100 in a PPV setup included in assembly test manufacturing. The PPV setup is run to make sure that all inputs/outputs (I/Os) are exercised, including executing a memory interface of the SIP module 100 at POR speed. The testing in the PPV setup further includes silicon screening for manufacturing defects, wafer sorting and class testing. Every package goes through the above testing before being shipped to an original equipment manager (OEM) or an original design manufacturer (ODM).

To test the memory interface running at the POR speed, the POP memories 105 and 110 may be attached to the SIP module 100 during the PPV setup. However, there may be several challenges and issues. For example, attaching the POP memories 105 and 110 to every parts of silicon may be a manual process that is time consuming and error prone. Further, memory cannot be soldered to the SIP module 100 and resoldered after the PPV testing due to wear and tear risks for a final product. In another example, the PPV setup may be complex, and any manual intervention in a PPV process may hinder an outcome and may significantly impact throughput, leading to delay in silicon shipment.

To address the above challenges and issues, embodiment described herein integrate a memory socket with a thermal head plate.

Figure 2A:
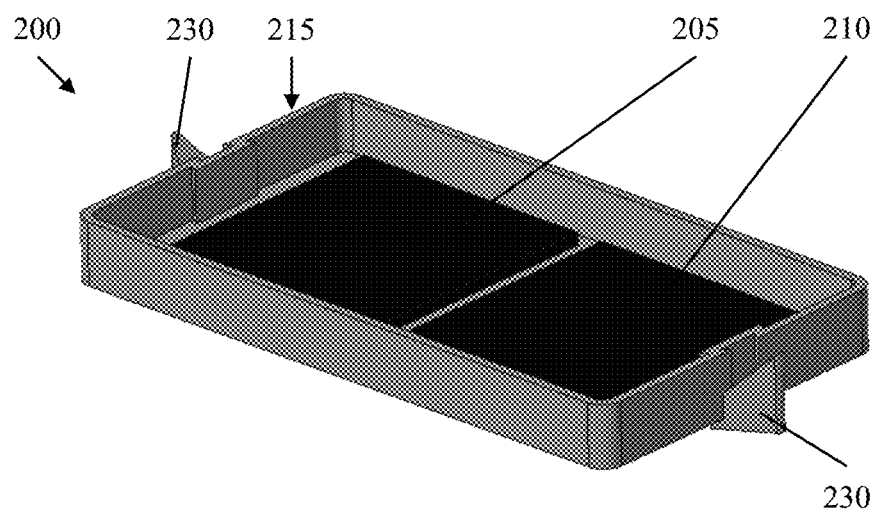
FIGS. 2A and 2B are perspective views of a memory interposer according to aspects of the present disclosure.
Figure 2B:
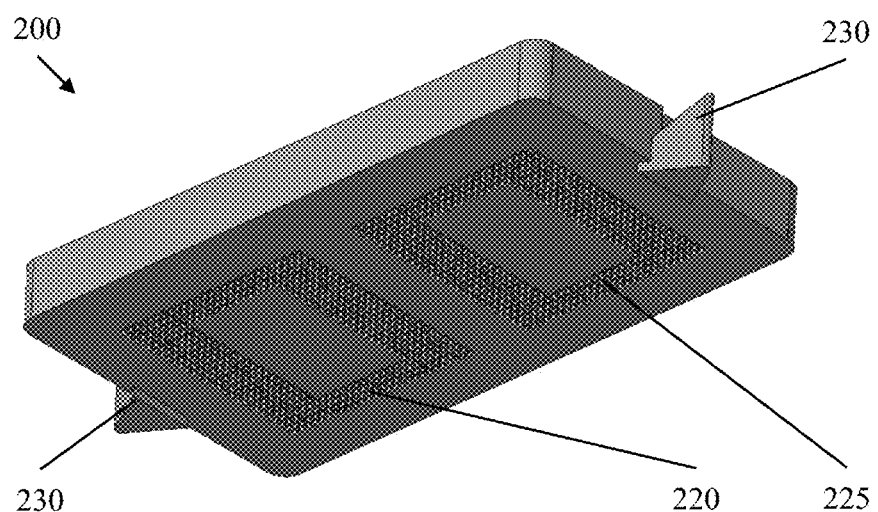

FIGS. 2A and 2B are perspective views of a memory interposer 200 according to aspects of the present disclosure.

Referring to FIG. 2A, a top perspective view of the memory interposer 200 is shown. The memory interposer 200 may be formed of insulating plastic, e.g., polyamide or acrylonitrile butadiene styrene. The memory interposer 200 may include a socket 215 including inner walls and an inner surface, and one or more memories 205 and 210 disposed or soldered on the inner surface included in the socket 215. Each of the one or more memories 205 and 210 may include LPDDR SDRAM. However, this is only an example, and other types of memory may be used.

Referring to FIG. 2B, a bottom perspective view of the memory interposer 200 is shown. The memory interposer 200 may further include pogo pins 220 and 225 disposed on a bottom surface of the memory interposer 200, the bottom surface being opposite to the inner surface included in the socket 215. The pogo pins 220 and 225 may respectively correspond to the memories 205 and 210 so that the pogo pins 220 and 225 may respectively connect the memories 205 and 210 to contact points disposed on an SIP module, e.g., shown in FIG. 4A. The pogo pins 220 and 225 may have a fine pitch of about 0.35 to 1 millimeter, and may be spring-loaded.

Referring to FIGS. 2A and 2B, the memory interposer 200 may further include outer walls and a self-alignment portion 230. The self-alignment portion 230 may include triangular extensions respectively extending from the outer walls included in the memory interposer 200. However, this is only an example, and the self-alignment portion 230 may include extensions of other shapes.

Figure 3A:
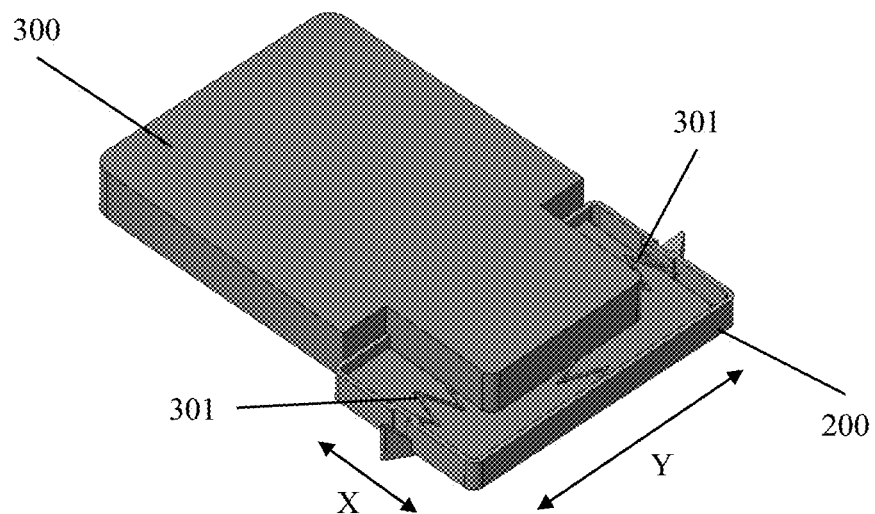
FIGS. 3A and 3B are perspective views of the memory interposer of FIGS. 2A and 2B that is attached to an intermediate thermal head, according to aspects of the present disclosure.
Figure 3B:
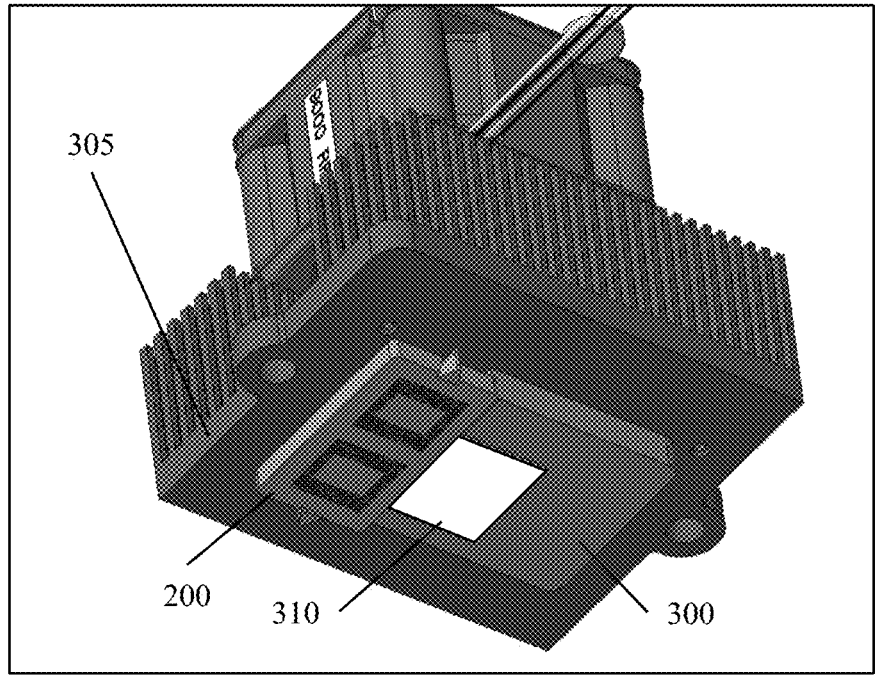

FIGS. 3A and 3B are perspective views of the memory interposer 200 of FIGS. 2A and 2B that is attached to an intermediate thermal head 300, according to aspects of the present disclosure.

FIG. 3A shows a top perspective view of the memory interposer 200 attached to the intermediate thermal head 300 including a plate of thermal conducting metal, e.g., copper. FIG. 3B shows a bottom perspective view of the memory interposer 200 attached to the intermediate thermal head 300. This assembly may allow attachment of the memories 205 and 210 of the memory interposer 200 to the SIP module and testing of the SIP module using the attached memories 205 and 210 to be simplified and reduced in time.

Referring to FIG. 3A, the memory interposer 200 may be movable or adjustable along an X-Y plane or in X- and Y-directions, with respect to (e.g., parallel to) top and bottom surfaces of the intermediate thermal head 300. This adjustability may allow safe, reliable and accurate alignment of the pogo pins 220 and 225 of the memory interposer 200 with the corresponding contact points disposed on the SIP module. In detail, X-Y movement of the memory interposer 200 may be achieved by flexural joints 301 interposed between the memory interposer 200 and the intermediate thermal head 300. The flexural joints 301 may allow the memory interposer 200 to self-align with the contact points disposed on the SIP module. The flexural joints 301 may include springs and/or portions etched in the intermediate thermal head 300 having enough room in which the memory interposer 200 may move, to prevent the memory interposer 200 from being too tightly connected to the intermediate thermal head 300 and being too tightly constrained in movement. As shown in FIG. 3A, one of the flexural joints 301 (a spring) is interposed between an inner wall of the socket 215 of the memory interposer 200 and an outer wall of a portion of the intermediate thermal head 300 that covers a portion of the memory interposer 200.

Referring to FIG. 3B, a main thermal head 305 is disposed on the assembly of the memory interposer 200 and the intermediate thermal head 300. The main thermal head 305 may perform heating and cooling of the assembly of the memory interposer 200 and the intermediate thermal head 300.

A die touchdown plate 310 may be disposed on a bottom surface of the intermediate thermal head 300, and may be formed of thermal interface material (TIM). The die touchdown plate 310 may cover and contact a die of the SIP module, and may prevent any force by the intermediate thermal head 300 to be applied to the die as the main thermal head 305 head applies force to the memory interposer 200 for contacting the SIP module. If the die touchdown plate 310 is not interposed between the intermediate thermal head 300 and the die, then unwanted microscopic grease material may instead fill an air gap interposed between the intermediate thermal head 300 and the die.

Figure 4A:
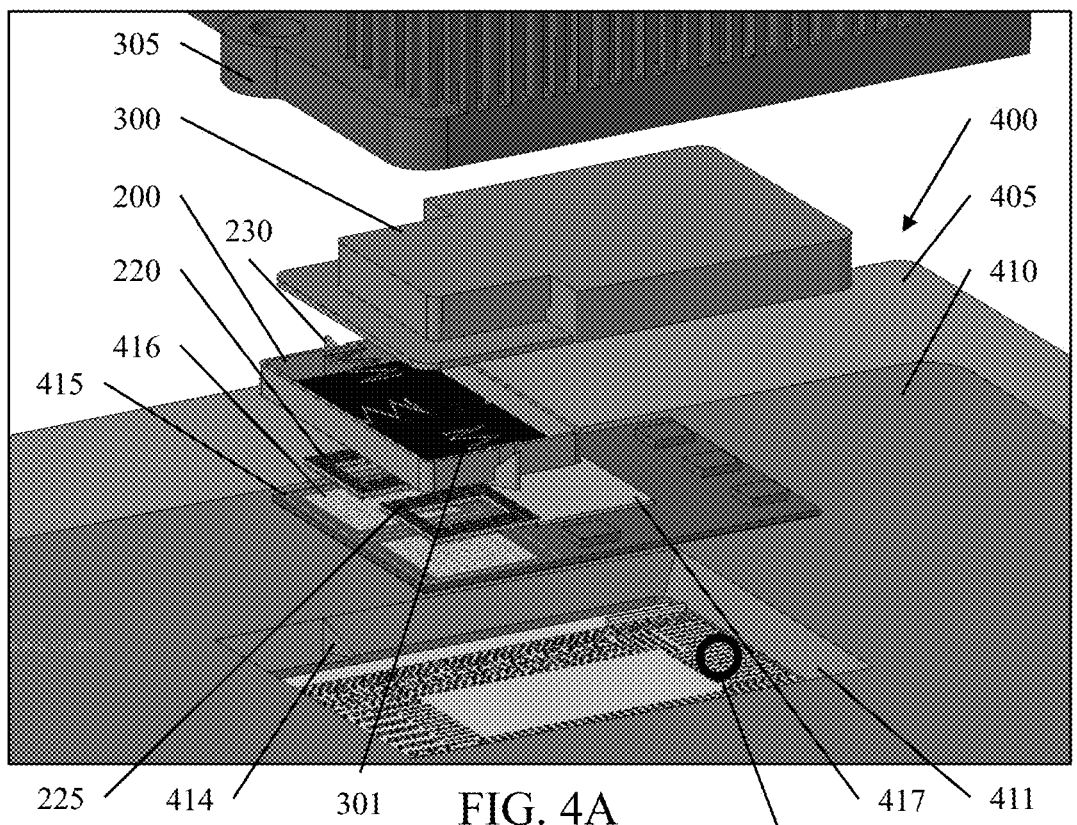
FIG. 4A is an exploded view of an assembly of the memory interposer and the intermediate thermal head of FIGS. 2A-3B while being attached to an SIP module, according to aspects of the present disclosure.
Figure 4B:
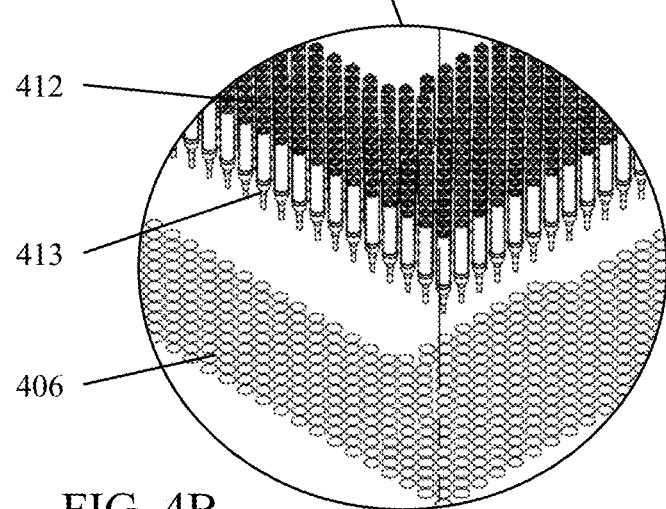
FIG. 4B is an enlarged exploded view of a test socket plate and a test board that are included in the SIP module of FIG. 4A, according to aspects of the present disclosure.
Figure 4C:
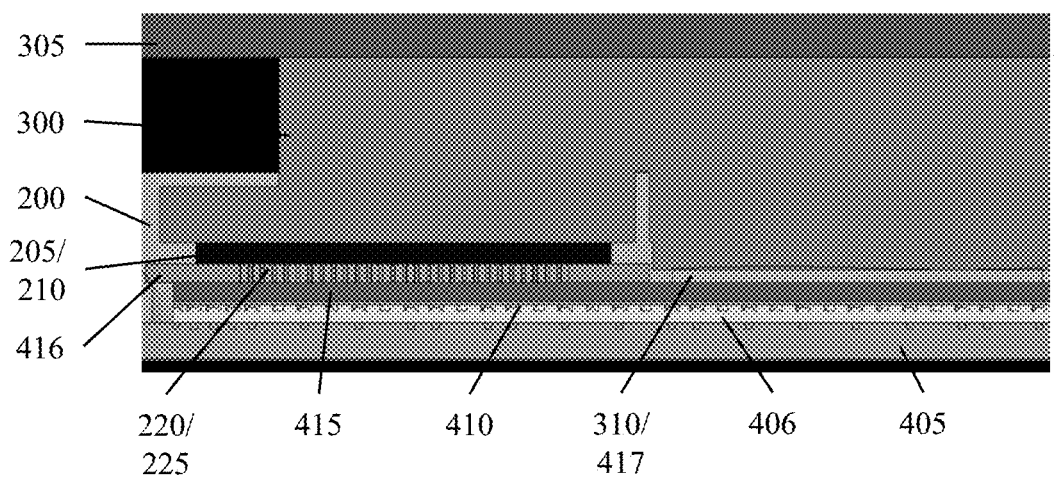
FIG. 4C is a cross-sectional view of the assembly of the memory interposer and the intermediate thermal head of FIGS. 2A-3B while being attached to the SIP module of FIG. 4A, according to aspects of the present disclosure.

FIG. 4A is an exploded view of an assembly of the memory interposer 200 and the intermediate thermal head 300 of FIGS. 2A-3B while being attached to an SIP module 400, according to aspects of the present disclosure. FIG. 4B is an enlarged exploded view of a test socket plate 410 and a test board 405 that are included in the SIP module 400 of FIG. 4A, according to aspects of the present disclosure. FIG. 4C is a cross-sectional view of the assembly of the memory interposer 200 and the intermediate thermal head 300 of FIGS. 2A-3B while being attached to the SIP module 400 of FIG. 4A, according to aspects of the present disclosure.

Referring to FIG. 4A, a robotic arm controls the assembly of the memory interposer 200 and the intermediate thermal head 300 to be attached to the SIP module 400. Thus, no manual intervention is required, and hence there may be no chance of human error, like misalignment of the test socket plate 410 with the memory interposer 200.

An overall force required by the intermediate thermal head 300 to ensure contact between the memory interposer 200 and the SIP module 400 may vary. For example, a number of balls disposed on one of the memories 205 and 210 of the memory interposer 200 may be 496, and a force required by the intermediate thermal head 300 to make each of the balls contact the SIP module 400 may be 25 gram-force. This results in the overall force required by the intermediate thermal head 300 to be about 12 kilogram-force for the one of the memories 205 and 210, and about 24 kilogram-force for both of the memories 205 and 210.

Referring to FIGS. 4A and 4B, the SIP module 400 includes the test board 405 (e.g., a PCB) and the test socket plate 410 disposed on the test board 405. The test socket plate 410 may be formed of metal (e.g., stainless steel), and includes a cavity 411 or socket in which first pogo pins 412 in a direction toward a top surface of the test socket plate 410 and second pogo pins 413 in a direction toward a top surface of the test board 405 are disposed.

The SIP module 400 further includes an LNL-DCA module 415 disposed in the cavity 411 of the test socket plate 410. The LNL-DCA module 415 may be a PCB including contact points 416 or contact pads disposed on a surface of the LNL-DCA module 415, and the contact points 416 may connect respectively to the pogo pins 220 and 225 of the memories 205 and 210 of the memory interposer 200. The LNL-DCA module 415 may further include an SoC die 417 disposed on the same surface of the LNL-DCA module 415. In embodiments, the LNL-DCA module 415 may further include CPU and GPU dies (not shown) disposed on the same surface of the LNL-DCA module 415. The LNL-DCA module 415 does not include a memory portion, and thus needs to be connected to the memory interposer 200, to be tested.

The test socket plate 410 includes a first surface interfacing with solder balls disposed on a bottom surface of the LNL-DCA module 415, and a second surface interfacing with contact pads 406 disposed on a top surface of the test board 405. The first pogo pins 412 are disposed on the first surface and contact the solder balls of the LNL-DCA module 415, and the second pogo pins 413 are disposed on the second surface and contact the contact pads 406 of the test board 405.

Referring again to FIG. 4A, the test socket plate 410 may further include a self-alignment portion 414 corresponding to the self-alignment portion 230 of the memory interposer 200. The self-alignment portions 230 and 414 may allow respectively the memory interposer 200 and the test socket plate 410 to be aligned when installed, without having to modify the LNL-DCA module 415 for alignment. The self-alignment portion 414 may include triangular slits etched in the test socket plate 410, and the triangular extensions of the self-alignment portion 230 may be fittable inside the triangular slits of the self-alignment portion 414. However, this is only an example, and the self-alignment portion 414 may include slits of other shapes.

Referring to FIG. 4C, a cross-sectional view of the main thermal head 305 applying a desired load on the LNL-DCA module 415 is shown. The test socket plate 410 is disposed on the test board 405, and the LNL-DCA module 415 is disposed in the cavity 411 of the test socket plate 410. The memory interposer 200 is disposed on the contact points 416 of the LNL-DCA module 415, and the die touchdown plate 310 is disposed on the SoC die 417 of the LNL-DCA module 415. In detail, the pogo pins 220 and 225 of the memory interposer 200 are disposed into the contact points 416, electrically connecting the memories 205 and 210 to the LNL-DCA module 415. The intermediate thermal head 300 is disposed on the memory interposer 200 and the die touchdown plate 310, and the main thermal head 305 is disposed on the intermediate thermal head 300.

The robotic arm and the main thermal head 305 may provide a downward pressure for forcing contact between the memory interposer 200 and the LNL-DCA module 415 installed in the test socket plate 410. A sequence of testing the LNL-DCA module 415 using the memories 210 and 215 connected to the LNL-DCA module 415 in the PPV setup is described below.

Figure 5:
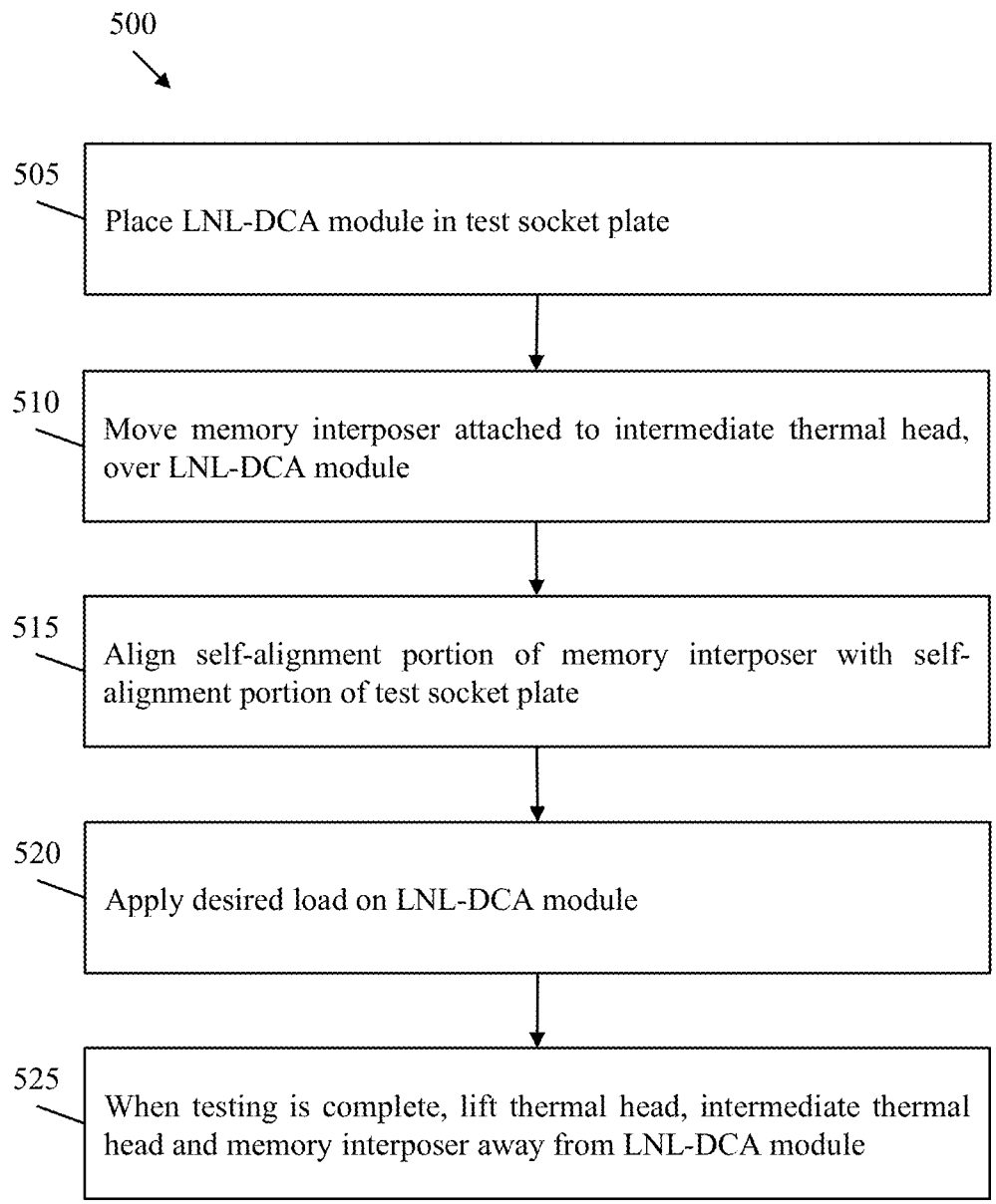
FIG. 5 is a flow diagram of a method of SIP module qualification in a product platform validation (PPV) setup, using a socket interposer, according to aspects of the present disclosure.

FIG. 5 is a flow diagram of a method 500 of SIP module qualification in a PPV setup, using a socket interposer, according to aspects of the present disclosure.

Referring to FIG. 5, operation 505 may be directed to controlling the robotic arm to place or install the LNL-DCA module 415 in the test socket plate 410. The LNL-DCA module 415 is aligned by the test socket plate 410, ensuring alignment and contact between the solder balls disposed on the bottom surface of the LNL-DCA module 415 and the corresponding first pogo pins 412 disposed on the first surface of the test socket plate 410.

Operation 510 may be directed to controlling the robotic arm to move the memory interposer 200 attached to the intermediate thermal head 300, over the LNL-DCA module 415. In embodiments, the robotic arm may be moving the main thermal head 305 to position the memory interposer 200 and the intermediate thermal head 300.

Operation 515 may be directed to controlling the robotic arm to align the self-alignment portion 230 of the memory interposer 200 with the self-alignment portion 414 of the test socket plate 410. Further, operation 515 may include controlling to press down, via the main thermal head 305, on the LNL-DCA module 415 so that the self-alignment portion 230 of the memory interposer 200 is disposed in the self-alignment portion 414 of the test socket plate 410. The X-Y planar movement of the memory interposer 200 with respect to the intermediate thermal head 300 may remove redundancy and over constraining of the assembly, and may ensure safe, reliable and accurate assembly of the memory interposer 200 with the LNL-DCA module 415. This may ensure that even if there is a small misalignment, the memory interposer 200 may enter the test socket plate 410, thus protecting the memory interposer 200, the LNL-DCA module 415 and the main thermal head 305.

Operation 520 may be directed to controlling to apply, via the main thermal head 305 disposed on the memory interposer 200 and the intermediate thermal head 300, a desired load on the LNL-DCA module 415. As a result, the main thermal head 305 may push the pogo pins 220 and 225 of the memory interposer 200 into the contact points 416 of the LNL-DCA module 415.

Operation 525 may be directed to, when the testing of the LNL-DCA module 415 using the connected memories 210 and 215 in the PPV setup is complete, controlling the robotic arm to lift the main thermal head 305, the intermediate thermal head 300 and the memory interposer 200 away from the LNL-DCA module 415.

The methods and sequence of steps presented above are intended to be examples for SIP module qualification in a PPV setup, using a socket interposer, according to the present disclosure. It will be apparent to those ordinary skilled practitioners that the foregoing process operations may be modified without departing from the spirit of the present disclosure.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a memory interposer including a socket including an inner surface, one or more memories disposed on the inner surface, a bottom surface opposite to the inner surface, and pogo pins disposed on the bottom surface and respectively corresponding to the one or more memories, the pogo pins being configured to connect the one or more memories to a printed circuit board (PCB) including a semiconductor die. The apparatus further includes an intermediate thermal head attached to the memory interposer. The memory interposer is movable with respect to the intermediate thermal head.

Example 2 may include the apparatus of example 1 and/or any other example disclosed herein, for which the memory interposer is formed of insulating plastic.

Example 3 may include the apparatus of example 1 and/or any other example disclosed herein, for which each of the one or more memories includes Low-Power Double Data Rate (LPDDR) synchronous dynamic random-access memory (SDRAM).

Example 4 may include the apparatus of example 1 and/or any other example disclosed herein, for which the pogo pins have a pitch of about 0.35 to 1 millimeter.

Example 5 may include the apparatus of example 1 and/or any other example disclosed herein, for which the memory interposer further includes an outer wall, and a self-alignment portion extending from the outer wall, and fittable inside a self-alignment portion formed in a test socket plate on which the SIP module is disposed.

Example 6 may include the apparatus of example 1 and/or any other example disclosed herein, for which the intermediate thermal head includes a plate of thermal conducting metal.

Example 7 may include the apparatus of example 1 and/or any other example disclosed herein, for which the memory interposer is movable along an X-Y plane parallel to a surface of the intermediate thermal head.

Example 8 may include the apparatus of example 1 and/or any other example disclosed herein, further including a spring. The socket further includes an inner wall, and the intermediate thermal head includes a portion covering a portion of the memory interposer. The portion included in the intermediate thermal head includes an outer wall, and the spring is interposed between the inner wall included in the socket and the outer wall included in the portion of the intermediate thermal head.

Example 9 may include the apparatus of example 1 and/or any other example disclosed herein, for which the intermediate thermal head includes a portion formed in the intermediate thermal head, in which the memory interposer is movable.

Example 10 may include the apparatus of example 1 and/or any other example disclosed herein, further including a die touchdown plate formed of thermal interface material (TIM). The intermediate thermal head includes a bottom surface, and the die touchdown plate is disposed on the bottom surface included in the intermediate thermal head.

Example 11 provides a method including controlling a robotic arm to place a printed circuit board (PCB) including a semiconductor die, in a test socket plate, and controlling the robotic arm to move a memory interposer attached to an intermediate thermal head, over the PCB placed in the test socket plate, the memory interposer including one or more memories connectable to the PCB. The method further includes controlling to apply, via a main thermal head disposed on the memory interposer attached to the intermediate thermal head, a desired load on the PCB over which the memory interposer attached to the intermediate thermal head is moved.

Example 12 may include the method of example 11 and/or any other example disclosed herein, further including controlling the robotic arm to align a self-alignment portion of the memory interposer with a self-alignment portion of the test socket plate.

Example 13 may include the method of example 12 and/or any other example disclosed herein, for which the controlling to apply the desired load includes, based on the self-alignment portion of the memory interposer being aligned with the self-alignment portion of the test socket plate, controlling to apply, via the main thermal head, the desired load on the PCB.

Example 14 may include the method of example 12 and/or any other example disclosed herein, for which the controlling the robotic arm to align the self-alignment portion of the memory interposer with the self-alignment portion of the test socket plate includes controlling to press down, via the main thermal head, on the PCB so that the self-alignment portion of the memory interposer is disposed in the self-alignment portion of the test socket plate.

Example 15 may include the method of example 11 and/or any other example disclosed herein, further including, based on testing of the PCB using the one or more memories connected to the PCB being complete, controlling the robotic arm to lift the main thermal head, the intermediate thermal head and the memory interposer away from the PCB.

Example 16 provides a non-transitory computer-readable medium including instructions, which, if executed by a processor, cause the processor to control a robotic arm to place a printed circuit board (PCB) including a semiconductor die, in a test socket plate, and control the robotic arm to move a memory interposer attached to an intermediate thermal head, over the PCB placed in the test socket plate, the memory interposer including one or more memories connectable to the PCB. The instructions, which, if executed by the processor, further cause the processor to control to apply, via a main thermal head disposed on the memory interposer attached to the intermediate thermal head, a desired load on the PCB over which the memory interposer attached to the intermediate thermal head is moved.

Example 17 may include the non-transitory computer-readable medium of example 16 and/or any other example disclosed herein, for which the instructions, which, if executed by the processor, further cause the processor to control the robotic arm to align a self-alignment portion of the memory interposer with a self-alignment portion of the test socket plate.

Example 18 may include the non-transitory computer-readable medium of example 17 and/or any other example disclosed herein, for which the instructions, which, if executed by the processor, further cause the processor to, based on the self-alignment portion of the memory interposer being aligned with the self-alignment portion of the test socket plate, control to apply, via the main thermal head, the desired load on the PCB.

Example 19 may include the non-transitory computer-readable medium of example 17 and/or any other example disclosed herein, for which the instructions, which, if executed by the processor, further cause the processor to control to press down, via the main thermal head, on the PCB so that the self-alignment portion of the memory interposer is disposed in the self-alignment portion of the test socket plate.

Example 20 may include the non-transitory computer-readable medium of example 16 and/or any other example disclosed herein, for which the instructions, which, if executed by the processor, further cause the processor to, based on testing of the PCB using the one or more memories connected to the PCB being complete, control the robotic arm to lift the main thermal head, the intermediate thermal head and the memory interposer away from the PCB.

Example 21 provides an apparatus including placing means for controlling a robotic arm to place a printed circuit board (PCB) including a semiconductor die, in a test socket plate, and moving means for controlling the robotic arm to move a memory interposer attached to an intermediate thermal head, over the PCB placed in the test socket plate, the memory interposer including one or more memories connectable to the PCB. The apparatus further includes applying means for controlling to apply, via a main thermal head disposed on the memory interposer attached to the intermediate thermal head, a desired load on the PCB over which the memory interposer attached to the intermediate thermal head is moved.

Example 22 may include the apparatus of example 21 and/or any other example disclosed herein, further including aligning means for controlling the robotic arm to align a self-alignment portion of the memory interposer with a self-alignment portion of the test socket plate.

Example 23 may include the apparatus of example 22 and/or any other example disclosed herein, for which the applying means is further for, based on the self-alignment portion of the memory interposer being aligned with the self-alignment portion of the test socket plate, controlling to apply, via the main thermal head, the desired load on the PCB.

Example 24 may include the apparatus of example 22 and/or any other example disclosed herein, for which the aligning means is further for controlling to press down, via the main thermal head, on the PCB so that the self-alignment portion of the memory interposer is disposed in the self-alignment portion of the test socket plate.

Example 25 may include the apparatus of example 21 and/or any other example disclosed herein, further including lifting means for, based on testing of the PCB using the one or more memories connected to the PCB being complete, controlling the robotic arm to lift the main thermal head, the intermediate thermal head and the memory interposer away from the PCB.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
 a memory interposer comprising:
  a socket comprising an inner surface;

one or more memories disposed on the inner surface;
a bottom surface opposite to the inner surface; and
pogo pins disposed on the bottom surface and respectively corresponding to the one or more memories, the pogo pins being configured to connect the one or more memories to a printed circuit board (PCB) comprising a semiconductor die; and
an intermediate thermal head attached to the memory interposer,
wherein the memory interposer is movable with respect to the intermediate thermal head; and
wherein the memory interposer is movable along an X-Y plane parallel to a surface of the intermediate thermal head.

2. The apparatus of claim 1, wherein the memory interposer is formed of insulating plastic.

3. The apparatus of claim 1, wherein each of the one or more memories comprises Low-Power Double Data Rate (LPDDR) synchronous dynamic random-access memory (SDRAM).

4. The apparatus of claim 1, wherein the pogo pins have a pitch of about 0.35 to 1 millimeter.

5. The apparatus of claim 1, wherein the memory interposer further comprises:
an outer wall; and
a self-alignment portion extending from the outer wall, and fittable inside a self-alignment portion formed in a test socket plate on which the SIP module is disposed.

6. The apparatus of claim 1, wherein the intermediate thermal head comprises a plate of thermal conducting metal.

7. The apparatus of claim 1, further comprising a spring,
wherein the socket further comprises an inner wall,
the intermediate thermal head comprises a portion covering a portion of the memory interposer,
the portion comprised in the intermediate thermal head comprises an outer wall, and
the spring is interposed between the inner wall comprised in the socket and the outer wall comprised in the portion of the intermediate thermal head.

8. The apparatus of claim 1, wherein the intermediate thermal head comprises a portion formed in the intermediate thermal head, in which the memory interposer is movable.

9. The apparatus of claim 1, further comprising a die touchdown plate formed of thermal interface material (TIM),
wherein the intermediate thermal head comprises a bottom surface, and
the die touchdown plate is disposed on the bottom surface comprised in the intermediate thermal head.

10. An apparatus comprising:
a memory interposer comprising:
a socket comprising an inner surface;
one or more memories disposed on the inner surface;
a bottom surface opposite to the inner surface; and
pogo pins disposed on the bottom surface and respectively corresponding to the one or more memories, the pogo pins being configured to connect the one or more memories to a printed circuit board (PCB) comprising a semiconductor die; and
an intermediate thermal head attached to the memory interposer,
wherein the memory interposer is movable with respect to the intermediate thermal head;
further comprising a spring,
wherein the socket further comprises an inner wall,
the intermediate thermal head comprises a portion covering a portion of the memory interposer,
the portion comprised in the intermediate thermal head comprises an outer wall, and
the spring is interposed between the inner wall comprised in the socket and the outer wall comprised in the portion of the intermediate thermal head.

11. The apparatus of claim 10, wherein the pogo pins have a pitch of about 0.35 to 1 millimeter.

12. The apparatus of claim 10, wherein the memory interposer further comprises:
an outer wall; and
a self-alignment portion extending from the outer wall, and fittable inside a self-alignment portion formed in a test socket plate on which the SIP module is disposed.

13. The apparatus of claim 10, wherein the intermediate thermal head comprises a plate of thermal conducting metal.

14. The apparatus of claim 10, wherein the memory interposer is movable along an X-Y plane parallel to a surface of the intermediate thermal head.

15. The apparatus of claim 10, wherein the intermediate thermal head comprises a portion formed in the intermediate thermal head, in which the memory interposer is movable.

16. The apparatus of claim 10, further comprising a die touchdown plate formed of thermal interface material (TIM),
wherein the intermediate thermal head comprises a bottom surface, and
the die touchdown plate is disposed on the bottom surface comprised in the intermediate thermal head.

17. An apparatus comprising:
a memory interposer comprising:
a socket comprising an inner surface;
one or more memories disposed on the inner surface;
a bottom surface opposite to the inner surface; and
pogo pins disposed on the bottom surface and respectively corresponding to the one or more memories, the pogo pins being configured to connect the one or more memories to a printed circuit board (PCB) comprising a semiconductor die; and
an intermediate thermal head attached to the memory interposer,
wherein the memory interposer is movable with respect to the intermediate thermal head; and
wherein the intermediate thermal head comprises a portion formed in the intermediate thermal head, in which the memory interposer is movable.

18. The apparatus of claim 17, wherein the memory interposer is formed of insulating plastic.

19. The apparatus of claim 18, wherein each of the one or more memories comprises Low-Power Double Data Rate (LPDDR) synchronous dynamic random-access memory (SDRAM).

* * * * *